US006207889B1

(12) United States Patent
Toyomura et al.

(10) Patent No.: US 6,207,889 B1
(45) Date of Patent: Mar. 27, 2001

(54) SOLAR BATTERY MODULES, INSTALLATION METHOD THEREOF, AND SOLAR POWER GENERATOR USING SUCH MODULES

(75) Inventors: Fumitaka Toyomura, Kyotanabe; Naoki Manabe, Soraku-gun, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/339,867

(22) Filed: Jun. 25, 1999

(30) Foreign Application Priority Data

Jun. 30, 1998 (JP) .................................. 10-199770
Jun. 22, 1999 (JP) .................................. 11-175207

(51) Int. Cl.⁷ ................................................. H01L 25/00
(52) U.S. Cl. ................................... 136/244; 52/173.3
(58) Field of Search ........................... 136/244; 52/173.3

(56) References Cited

U.S. PATENT DOCUMENTS 3,620,846 * 11/1971 Paine ..................................... 136/245
4,152,174 * 5/1979 Ludlow ................................. 136/244

FOREIGN PATENT DOCUMENTS

| 7-211932 | 8/1995 | (JP) . |
| 7-302924 | 11/1995 | (JP) . |
| 10-12911 | 1/1998 | (JP) . |
| 10-65198 | 3/1998 | (JP) . |

* cited by examiner

*Primary Examiner*—Mark Chapman
(74) *Attorney, Agent, or Firm*—Fitzpatrick, Cella, Harper & Scinto

(57) ABSTRACT

A solar battery module and its installation method are provided which are good in installation workability, which can shorten a cable, and can match various roof shapes. A distance between an output terminal and the end face of a solar battery module along a line between output terminals of adjacent solar modules is longer upon installation completion of the adjacent solar battery modules than during electrical connection of the adjacent solar battery modules.

22 Claims, 10 Drawing Sheets

SOLAR BATTERY MODULES, INSTALLATION METHOD THEREOF, AND SOLAR POWER GENERATOR USING SUCH MODULES

BACKGROUND OF THE INVENTION

1. Field of the Invention

The present invention relates to solar battery modules, an installation method thereof, a roof and a solar power generator using such modules.

2. Related Background Art

With the recent rise in consciousness with regard to ecology, solar batteries which supply clean energy are in great demand.

Solar batteries installed on tiles of a house roof or on a building top floor or wall are increasing year after year.

Not only are solar batteries installed on a house roof, but also construction material integrated type solar battery modules such as "tile material integrated type solar battery modules" and "wall material integrated type solar battery modules", which comprise that construction materials integrally used with the modules, are developed and used widely.

For example, the publication of Japanese Patent Application Laid-Open No. 7-211932 discloses vertical tile bar roof type solar battery modules which are installed on a roof base plate made of wood, mortar, cement or the like by using spacers. Electrical connection between adjacent vertical tile bar roof type solar battery modules is established by electrical wires with connectors accommodated in a space between the solar battery modules and the roof base plate (Conventional Example 1).

Japanese Patent Application Laid-Open No. 7-302924 discloses horizontal tile roof type solar battery modules which are installed on a roof base plate such as a tile plate. Electrical connection between adjacent horizontal tile roof type solar battery modules is established by electrical wires accommodated in a space between the solar battery modules and the roof base plate (Conventional Example 2).

As shown in FIG. 13, in installing vertical tile bar roof type solar battery modules disclosed in Japanese Patent Application Laid-Open No. 7-211932 on a roof, a solar battery module 201 is temporarily fixed to the steps formed by spacers 202 and core rafters 204, and suspending parts 203 of the solar battery module 201 are fixed to the spacers 202 with nails 205.

In installing another solar battery module 206 at the position adjacent to the solar battery module 201, first an electrical wire 207 with a connector connected to an output terminal 212 of the solar battery module 201 is pulled outside of an end 208 of the solar battery module 201 and connected to an electrical wire 209 with a connector connected to an output terminal 213 of the other solar battery module 206. While the electrical wires connected together are pushed in a space between a roof base plate 210 and the already installed solar battery module 201 and the other solar battery module 206, the other solar battery module 206 is temporarily fixed to the steps formed by the spacers 202 and core rafters 203, and suspending parts 211 of the solar battery module 206 are fixed to the spacers 202 with nails. In this case, in order to make a waterproof roof, the solar battery module 206 adjacent to the module 201 in the roof rafter direction is partially overlapped with the end portion of the module 201 by using a caulking compound comprising a high polymer elastic material. Reference numeral 214 shown in FIG. 13 represents such an overlapped portion.

By repeating the above operations, a predetermined number of solar battery modules are connected together, and they are further connected to an inverter or a connection box via extension leads to constitute a solar power generator which can supply a desired power.

As shown in FIG. 14, a plurality of horizontal tile roof type solar battery modules 301 disclosed in Japanese Patent Application Laid-Open No. 7-302924 are installed on a roof base plate 302. Electrical connection between adjacent horizontal tile roof type solar battery modules 301 and 304 is established by electrical wires 305 accommodated in a space between the solar battery modules and the roof base plate 302. In this manner, a horizontal tile roof type unit is constituted.

In installing another solar battery module 304 at the position adjacent to the solar battery module 301, first an electrical wire 308 with a connector connected to an output terminal 314 of the solar battery module 301 is pulled outside of an end 309 of the solar battery module 301 and connected to an electrical wire 307 with a connector connected to an output terminal 315 of the other solar battery module 304. While the electrical wires connected together are pushed in a space between a roof base plate 302 and the already installed solar battery module 301 and the other solar battery module 304, the other solar battery module 304 is temporarily fixed by engaging an eaves-side coupling 312 of the module 304 to a beam-side coupling 310 of another horizontal tile roof type solar battery module 306 adjacent to the module 304 in a roof rafter direction. Then, the eaves-side coupling 312 of the module 304 is fixed by using a suspending part so that the module 304 is installed completely. In this case, in order to make a water-proof roof, a water repelling joint plate 313 is disposed at a joint extending toward a main roof beam between adjacent solar battery modules.

By repeating the above operations, a predetermined number of solar battery modules are connected together, and they are further connected to an inverter or a connection box via extension leads to constitute a solar power generator which can supply a desired power.

In order to install vertical tile bar roof type solar battery modules, it is necessary as described above to pull the electrical wires outside of the end 309 of each solar battery module 301 by a predetermined length in order to establish an electrical connection. Therefore, electrical wires with connectors may be squeezed inadvertently between the modules and core rafters, partially exposed over the surfaces of the modules or damaged.

Also in installing horizontal tile roof type solar battery modules, electrical wires with connectors may be squeezed inadvertently between the beam-side coupling of one horizontal tile roof type solar battery module and the eaves-side coupling of an adjacent horizontal tile roof type solar battery module, partially exposed over the surfaces of the modules or damaged.

Also in both cases, the radius R of curvature of each electrical wire becomes very small after installation. Therefore, a large stress is applied to the coating of an electrical wire.

If the electrical wire is made short in order to solve the above problems, work efficiency is lowered, as it takes a long time to install solar battery modules.

In the case of Japanese Patent Application Laid-Open No. 7-302924, if a roof shape is not rectangular such as a four-descending-beam roof, the shape of a rectangular solar battery module does not match the angles of adjacent descending beams. Therefore, steel plates having particular shapes, which cover the areas not occupied by rectangular solar battery modules, are required. Since the areas where the steel plates are used do not contribute to the generation of electricity, power generation per unit area is lowered.

SUMMARY OF THE INVENTION

In order to solve the above problems, the invention provides a solar battery module wherein a distance between an output terminal and an end face of a solar battery module along a line connecting output terminals of adjacent solar modules is longer upon installation completion of the adjacent solar battery modules than during electrical connection for the adjacent solar battery modules.

Further, the present invention provides a solar battery module comprising a wiring, one end of which is fixed to a start point; a photovoltaic element; and a supporting plate, wherein a wire drawing out side of the supporting plate is inclined with regard to another two sides sandwiching the wire drawing out side and wherein a distance from the start point to the other end of the wiring is shorter than a maximum distance from the start point to the end of the wire drawing out side.

The present invention provides a method for mounting a solar battery module comprising a wiring, one end of which is fixed to a start point; a photovoltaic element; and a supporting plate, wherein a wire drawing out side of the supporting plate is inclined with regard to another two sides sandwiching the wire drawing out side and wherein a distance from the start point to the other end of the wiring is shorter than a maximum distance from the start point to the end of the wire drawing out side.

The present invention provides a roof comprising a solar battery module comprising a wiring, one end of which is fixed to a start point; a photovoltaic element; and a supporting plate, wherein a wire drawing out side of the supporting plate is inclined with regard to another two sides sandwiching the wire drawing out side and wherein a distance from the start point to the other end of the wiring is shorter than a maximum distance from the start point to the end of the wire drawing out side.

The shape of the solar battery module is generally a rectangle having at least one slanted side, such as a trapezoid, a parallelogram, a trapezoid with one upright shorter side, or a rectangle with square recesses at diagonal corners. Although the shape changes slightly because of a bending work or a recess forming work for mounting the solar battery module, generally the above-described shapes may be used.

In a solar battery module installing method of this invention, a distance between an output terminal and an end face of a solar battery module along a line connecting output terminals of adjacent solar modules is made longer upon installation completion of the adjacent solar battery modules than during electrical connection for the adjacent solar battery modules.

In a conventional solar battery module, a distance between an output terminal and an end face of the solar battery module along a line connecting output terminals of adjacent solar modules does not change upon installation completion of the adjacent solar battery modules and during electrical connection for the adjacent solar battery modules. Therefore, a marginal length of the electrical wire is long upon installation completion, so that the electrical wire with a connector may be sandwiched between the solar battery module and a core rafter or between an eaves-side coupling of a horizontal tile roof type solar battery module and a beam-side coupling of another horizontal tile roof type solar battery module, may remain in such a sandwiched state, or may be damaged.

According to the invention, a distance between an output terminal and an end face of a solar battery module along a line connecting output terminals of adjacent solar modules is longer upon installation completion of the adjacent solar battery modules than during electrical connection for the adjacent solar battery modules. It is therefore possible to prevent the electrical wire from being squeezed, exposed over the module, or damaged.

Furthermore, the shape of the solar battery module is generally a rectangle having at least one slanted side. If the shorter side is slanted and matched with an angle of each descending beam of a multi-beam roof, a wasted area of the roof can be reduced which is otherwise caused by the mismatch of angles between the module and descending beam. It is therefore possible to prevent power generation per unit roof area from being lowered. A steel plate is not required, there by improving work efficiency.

DETAILED DESCRIPTION OF THE PREFERRED EMBODIMENTS

Figure 1A:
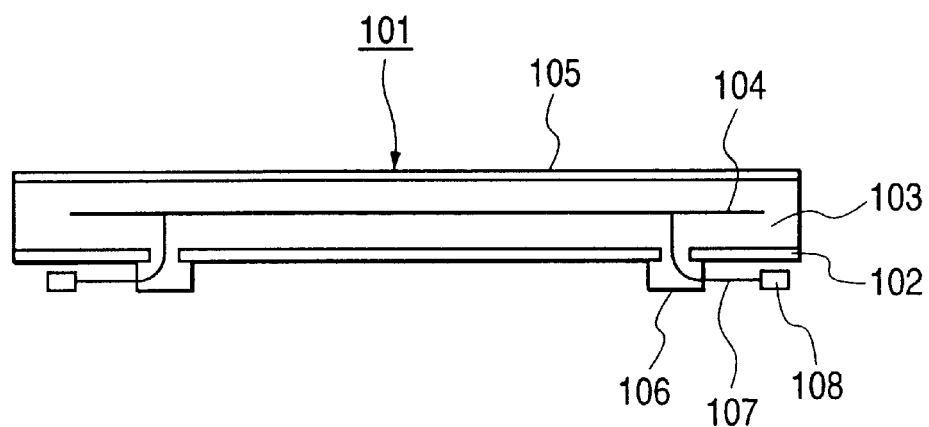
FIGS. 1A and 1B are cross-sectional views of a solar battery module according to an embodiment of the invention.
Figure 1B:
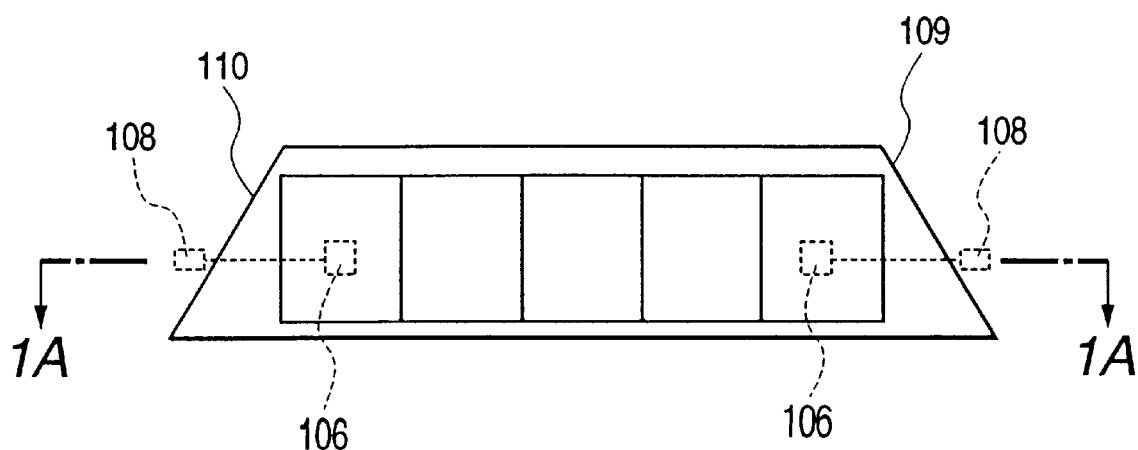

FIGS. 1A and 1B are schematic diagrams showing a solar battery module according to an embodiment of the invention. FIG. 1A is a cross-sectional view of the solar battery module of the embodiment, and FIG. 1B is a front view of the solar battery module as viewed from its light reception surface side. FIG. 1A is a schematic cross-sectional view taken along line 1A—1A of FIG. 1B.

The solar battery module 101 shown in FIGS. 1A and 1B has solar cells 104 held by a lamination member 103 over a back surface reinforcing member 102 serving as a support plate. The surface of the lamination member 103 is covered with a transparent film 105, the lamination member being filled in between the solar cells 104, back surface reinforcing member 102 and transparent film 105.

Connection boxes 106 are mounted on the back surface reinforcing member 102, and cables 107 with connectors 108 are pulled out of the connection boxes 106. The cable 107 is electrically connected to the solar cell 104. The connector 108 may be used if necessary in order to facilitate electrical connection or improve water proofness.

The solar battery module 101 has short sides 109 and 110 not in parallel and is trapezoidal as shown in FIG. 1B.

Figure 2A:
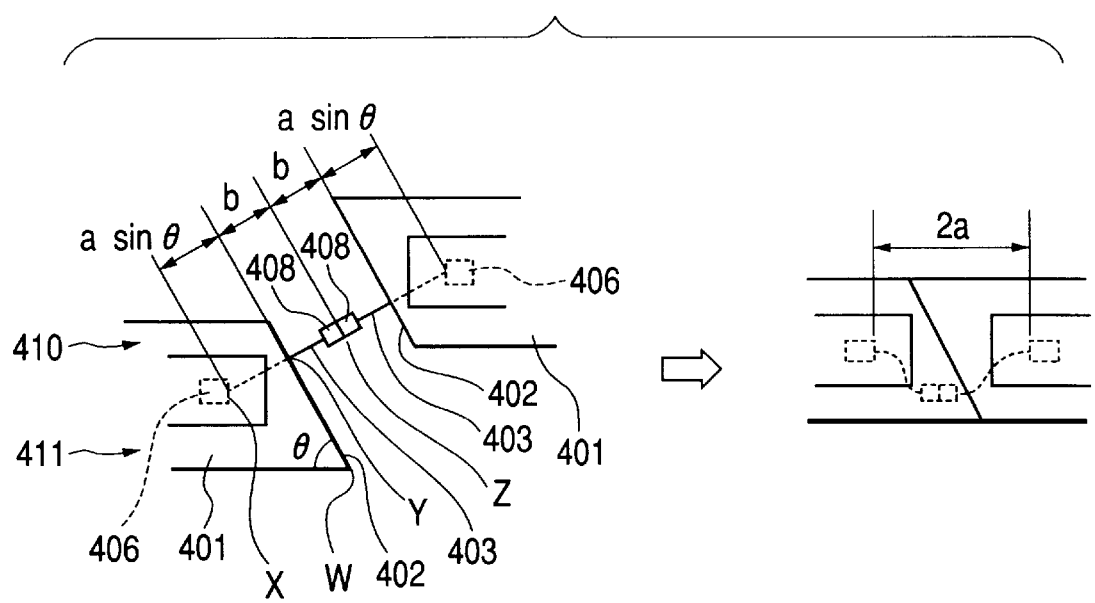
FIGS. 2A and 2B are diagrams illustrating a difference between the solar battery module shown in FIGS. 1A and 1B and a conventional solar battery module.
Figure 2B:
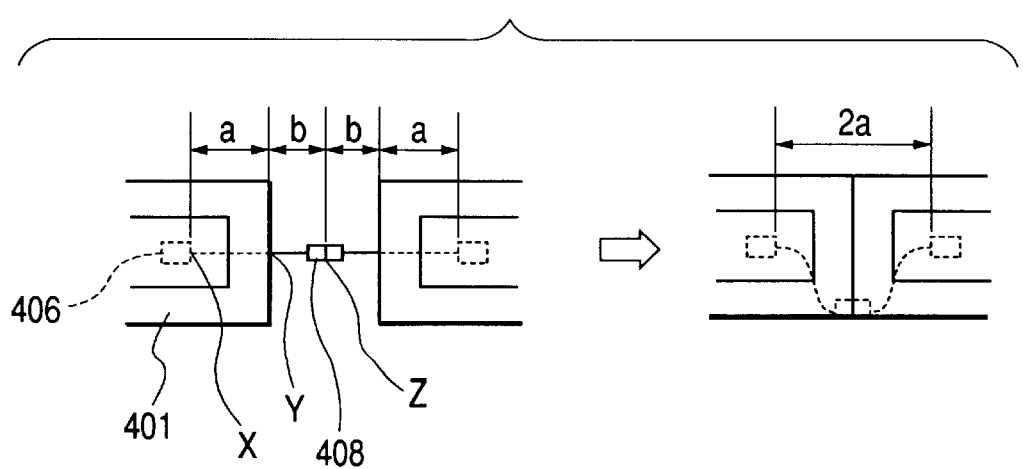

As shown in FIG. 2A, in order to pull the cable 403 with a connector by a length b from an end surface 402 of the solar battery module of this embodiment, it is sufficient if the cable has a length of a sin θ+b, whereas a conventional cable is required to have a length of a+b as shown in FIG. 2B. The end surface 402 constitutes one side of the trapezoid as viewed from the light reception surface side, whereas it constitutes a surface in terms of a thickness of the solar battery module starting from the light reception surface.

The cables 403 of the solar battery modules 401 shown in FIG. 2A extend substantially linearly in an electrically connected state. Each cable 403 intersects perpendicularly with the end surface 402 or one side of the solar battery module 401.

In this case, the solar battery modules 401 are spaced apart from each other. This state corresponds, for example, to a state in which solar battery modules 401 are connected by the cables 403 at the installation site on a roof.

The distance of a sin e shown in FIG. 2A is a distance between a point X at which the cable 403 is pulled from the connection box 406 and a point Y at which the linearly extending cable 403 perpendicularly crosses the end face 402. In this embodiment, although the point at which the cable 403 is pulled out from the connection box 406 is defined as the point X, the point X may be any start point from which the cable can change its direction freely. Among the four sides of a trapezoid, the cable is pulled from at least one side. This side has two angles relative to the other sides at both ends of this side. This side is called a broader angle side 410 on the side having a broader angle and is called a narrower angle side 411 on the other side. In FIG. 2A, the cable 403 extends out of the module from the broader angle side 410 and is connected to the other cable.

In this embodiment, although the distance b is defined as a distance between a point Y and an end of the connector 408, the distance b may be defined as a distance between the point Y and an end Z of the cable 403 in the case wherein the connector 408 is not used. Further, according to the present embodiment, the length from the start point X, one end of the wiring 403, to the end Z is desirably shorter than the length from the start point X to the point W at which the distance of the side 402 is maximum.

Next, the detailed description will be given for a solar battery module, a mounting member, an electrical wire, a connector, a bending process for a solar battery module, an electrical connection and a roof base plate, respectively used for the embodiment.

Solar Battery Module

The solar battery module is not specifically limited. For a silicon semiconductor solar cell, a single crystal solar cell, a polysilicon solar cell, an amorphous solar cell and the like may be used. For a solar cell of compound semiconductor, a group III–V compound semiconductor solar cell, a group II–VI compound semiconductor solar cell, a group I–III–VI compound semiconductor solar cell and the like may be used.

The solar battery module is effective if it has the shape of a triangle, trapezoid, parallelogram, or the like.

The solar battery module is preferably a solar battery module made of amorphous silicon solar cells, which module uses a weather resistant film as the transparent film, i.e., as a solar battery module surface protective film, and uses a steel plate commonly used for a metal roof as the back surface reinforcing member. For example, the solar battery module may be formed in a vertical tile bar roof shape, a horizontal tile roof shape, or a bent plate roof shape having an opposite bending direction to that of the vertical tile bar roof shape.

An amorphous silicon solar battery can be made of a thin film formed on a film substrate or a conductive substrate so that it can be made light in weight. An amorphous silicon solar battery, particularly a battery using a conductive substrate, has a strong mechanical structure and is flexible so that it provides a high degree of shape freedom and can match various roof and wall shapes.

The solar battery module has a structure that a distance between an output terminal and the end face of a solar battery module along a line connecting output terminals of adjacent solar modules is longer upon installation completion of the adjacent solar battery modules than during electrical connection for the adjacent solar battery modules.

The shape of the solar battery module is generally hexahedron and may have some uneven portions such as a mounting member for the solar battery module.

More specifically, this uneven portion may be not only the mounting member but also a recess formed on the shorter side of a trapezoid, parallelogram, or rectangle on a light reception surface side. This will be later described with reference to FIG. 12. If the angle between a shorter side and a longer side is equal to the angle of the descending beam of a roof, the solar battery modules present a fine view of the roof.

If the solar battery module is used also as the roof material, it is preferable that a coupling portion, a flat joint portion or an overlap portion has a water proof structure or that a water proof member is additionally used.

Mounting Member

The member for mounting the solar battery module on a roof base plate or the like is not limited specifically. It may be a screw, a bolt, a nut, a nail, a stapler, a tapping screw, a wing bolt, a wing nut, a suspending part or the like.

This mounting member is preferably subjected to proper surface processing from the viewpoint of rust proofing and weather resistance. Surface processing may be metal plating using copper, nickel, chrome, black chrome, black nickel, tin alloy, copper alloy, gold, gold alloy, silver, unichrome, chromate, zinc, cadmium, non-electrolyte nickel, industrial hard chrome or tin.

The suspending part is a member formed through a bending process. This suspending part of a solar battery module serving as the roof base plate mechanically fixes (holds) the module. The bent shape of the suspending part is not limited specifically. Instead suspending part, the solar battery module of the may be fixed, for example, by placing the module not bent as the roof base plate on a roof fixing member made of steel having an H-character cross section and coupling the roof fixing member and the roof base plate at their overlap portion with screws.

Electrical Wire

An electrical wire is not limited specifically. Although a cable structure is preferable, an insulated electrical wire may also be used.

Any electrical wire can be used which exhibits heat resistance, cold resistance, mechanical strength, electrical dielectric strength, water resistance, oil resistance, abrasion resistance, acid resistance and alkali resistance, in accordance with use environments.

More specifically, an electric wire may be a 600 V polyethylene cable (EV, EE, CV, CE) of JIS C 3605 specifications, a 600 V EP rubber insulating cable (PN, PV) of JIS C 3621 specifications, a 600 vinyl insulating vinyl sheath (flat type) cable (VVR, VVF) of JIS C 3342 specifications, a first, second, third, or fourth rubber insulating rubber cabtyre cable (1CT, 2CT, 3CT, 4CT) of JIS C 3327 specifications, a second, third, or fourth rubber insulating chloroplene cabtyre cable (2RNCY, 3RNCT, 4RNCT) of JIS C 3327 specifications, a second, third, or fourth EP rubber insulating chloroplene cabtyre cable (2PNCT, 3PNCT, 4PNCT) of JIS C 3327 specifications, or a vinyl insulating vinyl cabtyre cable of JIS C 3312 specifications.

An allowable bending radius of an electrical wire when a solar battery module is installed is preferably the diameter of the electrical wire multiplied by six or more. It is preferable that the distance between connection boxes of adjacent solar battery modules and the length of the electrical wire with a connector are determined to satisfy the allowable bending radius.

Connector

The material and shape of the connector are not limited specifically. Any connector may be used so long as it is excellent in heat resistance, humidity resistance, water resistance, electrical dielectric strength, cold resistance, oil resistance, weather resistance, mechanical strength, water proofness, or connection feasibility.

For example, the material of the connector may be vinyl chloride, polyethylene resin, polyamide resin, vinylidene fluoride resin, chloroprene rubber, ethylene propylene rubber, silicon resin, fluorine resin, denaturated PPO, denaturated PPE, nylon, polycarbonate, polybutylene terephthalate, polypropylene, or copolymer of ethylene polypropylene rubber and polypropylene.

Method of Bending Solar Battery Module

The solar battery module may be subjected to bending as described earlier. A method of bending a solar battery module is not limited specifically. A bending machine, a roller former, a press or the like may be used. The material of a mold to be used by a bending machine is preferably such material which is not likely to form scratches or damage the surface of a solar battery module. If the surface of a solar battery module is made of a weather resistant film likely to be scratched, such as a fluorine resin film, it is preferable to use such a bending machine. For example, a weather resistant film side of a solar battery module is placed on a mold made of soft material such as urethane resin, and a blade is placed on and pressed against the back surface reinforcing member to bend the module. The radius of curvature of the blade to be pressed against the weather resistant film is preferably 3R or larger.

Electrical Connection

An electrical connection between solar battery modules is established in the space between the solar battery modules and the underlying roof base plate. General electrical connection methods may be adopted, such as a connector type, a crimp sleeve type and a solder type.

Roof Base Plate

The roof base plate is a member used for forming a roof, wall or the like of a building. The roof base plate is desired to exhibit resistance to a local load imparted by a working person, water resistance, heat resistance, heat insulation and the like. The roof base plate may be made of wood, mortal, cement, heat insulating material or the like.

For purposes of waterproofing, heat insulating and the like, asphalt-containing resin roofing, vinyl chloride-containing resin roofing, polyester-containing resin roofing, and roofing using roof tile material or heat insulating material such as polystyrene-containing resin heat insulating material and polyurethane-containing resin heat insulating material are often used.

EXAMPLES

The present invention will be detailed by referring to examples. The invention is not limited only to these examples.

Example 1

Figure 3A:
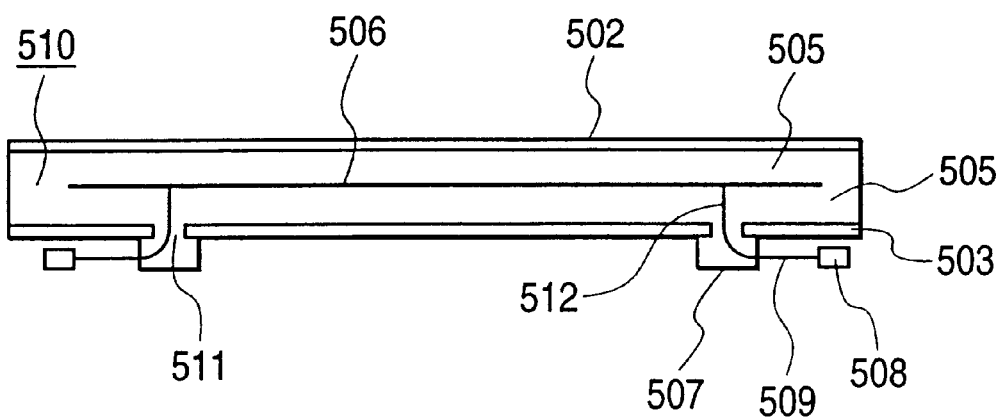
FIGS. 3A and 3B are cross-sectional views of a solar battery module according to a first example of the invention.
Figure 3B:
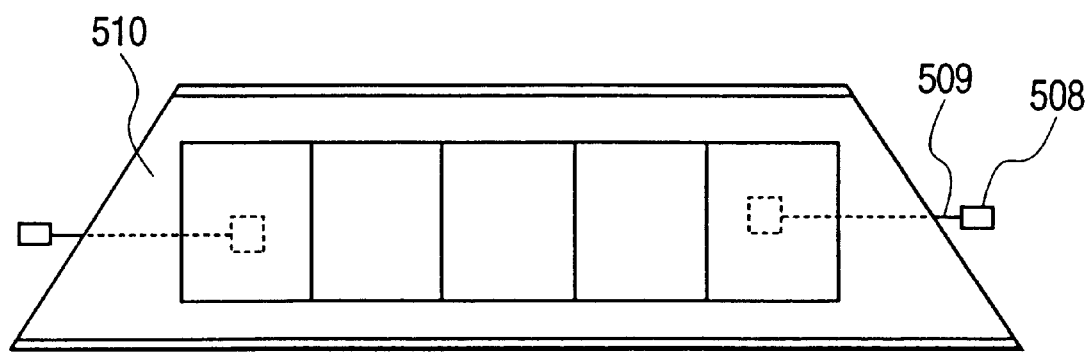
Figure 4:
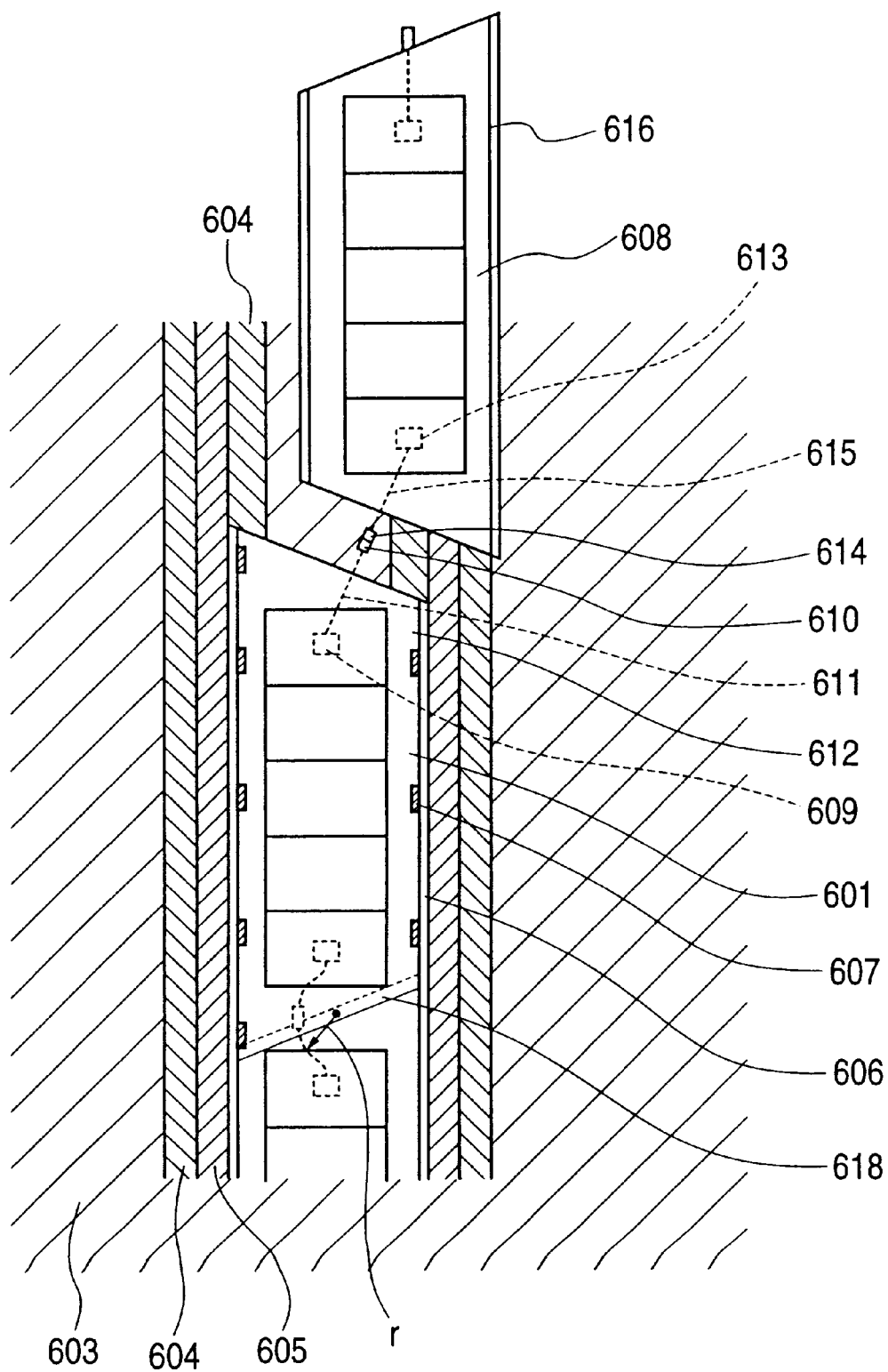
FIG. 4 is a schematic diagram illustrating installation of solar battery modules shown in FIGS. 3A and 3B.

FIG. 3A is a side elevational cross-sectional view of a solar battery module 510 according to Example 1, and FIG. 3B is a front view of the module as viewed from the light reception surface side. FIG. 4 is a schematic diagram illustrating installation of solar battery modules of Example 1. Reference numeral 503 represents a back surface reinforcing member, reference numeral 505 represents a filler, reference numeral 506 represents solar cells, reference numeral 507 represents a terminal box, reference numeral 508 represents a connector, reference numeral 509 represents a cable, reference numeral 511 represents a hole formed through the back surface reinforcing member 503, and reference numeral 512 represents an output lead wire.

In Example 1, the solar battery module 510 was formed by using ETFE (ethylene tetrafluoroethylene) as a weather resistant film 502 and a steel plate coated with polyester resin as the back surface reinforcing member 503. Next, a method of manufacturing a solar battery module and a method of installing solar battery modules will be described.

First, the back surface reinforcing member 503, filler 505, solar cells 506, filler 505 and weather resistant film 502 were laminated in this order, and the fillers 505 were melted at 150° C. by using a vacuum laminator to form a solar battery module whose solar cells 506 are resin-sealed by the back surface reinforcing member 503 and weather resistant film 502. A steel plate (0.4 mm thick) coated with polyester resin was used as the back surface reinforcing member 503, EVA (ethylene-vinyl acetate copolymer weather resistant grade) was used as the filler 505, and ETFE (ethylene tetrafluoroethylene) was used as the weather resistant film 502.

A hole 511 having a diameter of 15 mm was formed in advance through the steel plate coated with the polyester resin along the central line of the steel, in order to expose an electrode pickup portion. The steel plate coated with the polyester resin is trapezoidal, having two short sides not in parallel.

The filler 505 in the hole 511 for drawing an electrode therefrom was cut with a cutter and removed to expose an electrode pickup portion (not shown) to which the output lead 512 with its insulating coating being peeled off in advance by about 5 mm was soldered. The terminal box 507 coated with a predetermined amount of adhesive was mounted covering the hole 511 and dried for 24 hours, to thereby adhere the terminal box 507 to the module and complete the final module.

A CV cable 509 250 mm in length with a connector 508 was electrically connected to the output lead wire 512 in the terminal box 507. The term "CV" is an abbreviation for cross-linked polyethylene "C" and polyvinyl chloride "V".

Thereafter, the longer side edges of the solar battery module were bent by 90 degrees along the longer side toward the incidence light side, i.e., light reception surface side, to complete a vertical tile bar roof type solar battery module 510.

Next, an example of installing vertical tile bar roof type solar battery modules on a roof will be described.

Referring to FIG. 4, a spacer 604 was fixed to a roof base plate 603, extending from the higher portion to lower portion of a roof. The upper area in FIG. 4 corresponds to the higher portion of the roof. A core rafter 605 was fixed to the spacer 604. A portion of the spacer 604 is not shown in an area where the core rafter 605 was placed on the spacer 604. The core rafter 605 was fixed using nails. The vertical tile bar type solar battery module 601 was placed on the adjacent steps formed by the spacers 604 and core rafters 605, i.e., on the steps having at least partial surfaces of the spacers 604 just above which the core rafters 605 are not placed.

Next, suspending parts 606 of the vertical tile bar roof type solar battery module 601 formed by bending were fixed to the core rafters 605 with nails 607.

In installing another solar battery module 608 at the position adjacent to the vertical tile bar roof type solar battery module 601 along a rafter direction, first a CV cable 611 with a connector 610 pulled out of the terminal box 609 of the module 601 is pulled from the broader angle side 612 of the trapezoid shorter side of the module 601 and connected to a CV cable 615 with a connector 614 pulled out of a terminal box 613 of the adjacent module 608. While the CV cables and connectors connected together are pushed in a space between the roof base plate 603 and the already installed solar battery module 601 and the other solar battery module 608, the other solar battery module 608 is temporarily fixed to the steps formed by the spacers 604 and core rafters 605, and the suspending parts 616 of the solar battery module 608 are fixed with nails. In this case, in order to make a waterproof roof, the solar battery module 608 adjacent to the module 601 in the rafter direction was partially overlapped with the module 601 by pushing independent foaming material (not shown) attached to the bottom surface of the module 608. Reference numeral 618 represents such an overlapped portion formed between the solar battery module 601 and another module installed before the module 601. A similar overlapped portion is also formed between the solar battery modules 601 and 608, which portion is not shown in FIG. 4.

By repeating the above operations, a predetermined number of solar battery modules were connected, and they were further connected to an inverter or a connection box via extension leads to supply a desired power from each module.

With the solar battery module of Example 1, the connector can be pulled out of the end surface of the module using the cable shorter than a conventional cable. Therefore, after the connectors of adjacent solar battery modules were connected and when the module still not fixed was installed, the curved cables were not squeezed between the modules 601 and 608 and core rafter 605.

Furthermore, since the radius R of curvature of the cable after the module was installed was able to be made large, stress applied to the cable coating was reduced.

Example 2

In Example 2, a method of manufacturing a solar battery module up to the bending step is the same as Example 1.

Figure 5:
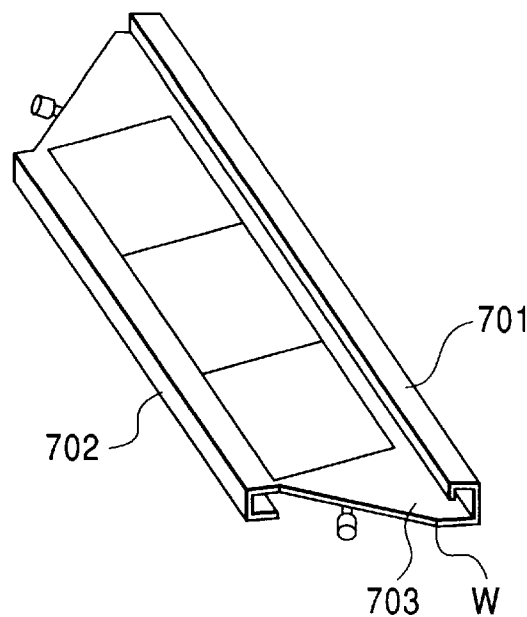
FIG. 5 is a schematic diagram illustrating a solar battery module according to a second example of the invention.
Figure 6:
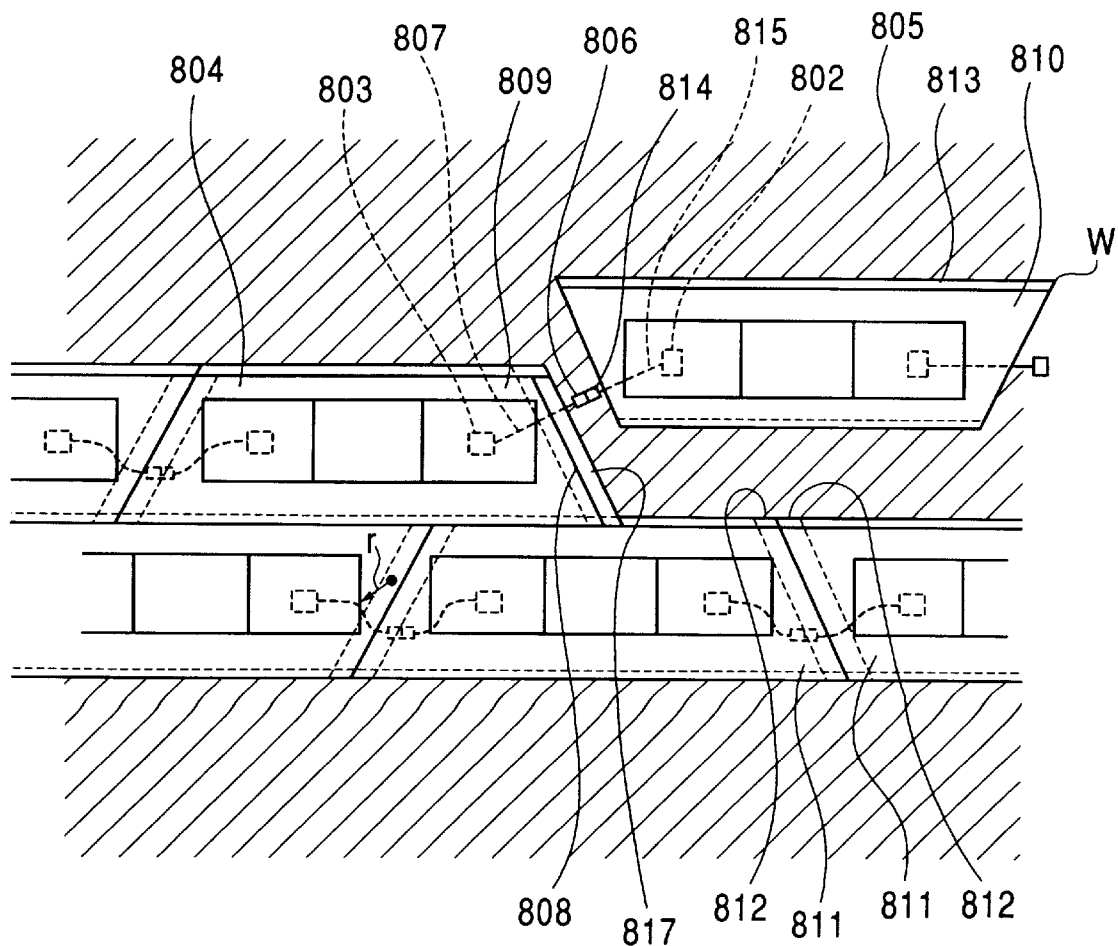
FIG. 6 is a schematic diagram illustrating installation of solar battery modules shown in FIG. 5.

FIG. 5 is a schematic diagram showing a solar battery module of Example 2. FIG. 6 is a schematic diagram illustrating installation of solar battery modules which in Example 2 are horizontal tile roof type solar battery modules.

A solar battery module manufactured in the manner similar to Example 1 is bent at its longer side end portions with a bending machine to form an eaves-side coupling 701 and a beam-side coupling 702 to complete a horizontal tile roof type solar battery module 703.

Next, an example of installing horizontal tile roof type solar battery modules on a roof will be described.

Referring to FIG. 6, in installing a horizontal tile roof type solar battery module 804 on a roof base plate 805, first a CV cable 807 with a connector 806 pulled out of a terminal box 803 of an already installed horizontal tile roof type solar battery module 804 is pulled from the broader angle side 809 of the trapezoid end face 808 of the module 804. In this case, in order to make a waterproof roof, a water repelling joint plate 817 which is a discrete member different from the solar battery module is disposed at a joint extending toward a main roof beam (in a right and left direction in FIG. 6 or horizontal direction). The CV cable 805 with the connector 806 was passed through the space between the water repelling joint plate 817 and roof base plate 805. The CV cable 807 is connected to a CV cable 815 with a connector 814 pulled out of a terminal box 802 of an adjacent horizontal tile roof type solar battery module 810 to be installed. While the CV cables 807 and 815 and their connectors 806 and 814 connected together are pushed in a space between the roof base plate 805 and the already installed solar battery module 804 and the other solar battery module 810 adjacent to the module 804 along the roof main beam direction, the adjacent module 810 is engaged with a beam-side coupling 812 of another module 811 on the eaves side adjacent to the module 810 to thereby temporarily fix the module 810. Thereafter, the beam-side coupling 813 of the module 810 is fixed using a fixing member such as unrepresented suspending parts. In the above manner, the horizontal tile roof type solar module 810 can be installed.

By repeating the above operations, a predetermined number of solar battery modules were connected, and they were further connected to an inverter or a connection box via extension leads to supply a desired power from each module.

With the solar battery module of Example 2, the connector can be pulled out of the end surface of the module using the cable shorter than a conventional cable. Therefore, after the connectors of adjacent solar battery modules were connected and when the module still not fixed was installed, the curved cables were not squeezed between the eaves-side coupling of one solar battery module and the beam-side coupling of another adjacent solar battery module.

Furthermore, since the radius R of curvature of the cable after the module was installed was able to be made large, stress applied to the cable coating was reduced. According to the present embodiment, the point W corresponding to the point W described in the first embodiment means a point which is on the wire drawing side of the supporting plate and which is mostly distant from the fixed wiring end. The length of the wiring is shorter than the distance from the fixed wiring end to the point W.

Example 3

Figure 7:
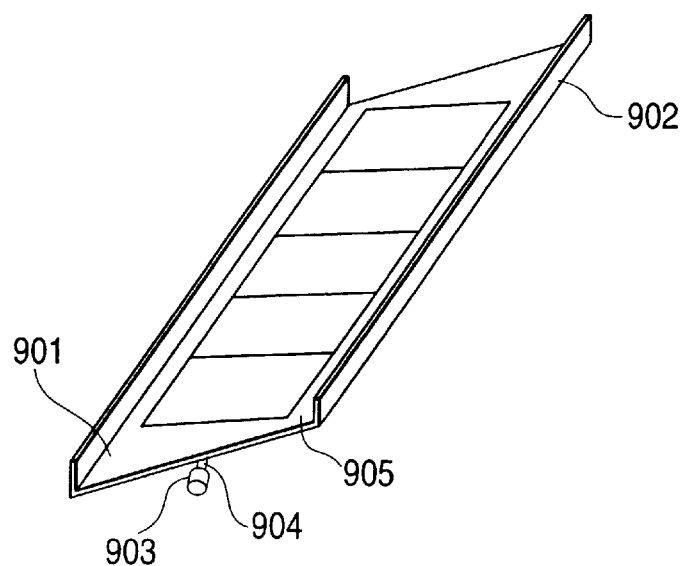
FIG. 7 is a schematic diagram showing a solar battery module according to a third example of the invention.

A vertical tile bar roof type solar battery module 901 was manufactured by the same method as that of Example 1, except that a steel plate coated with polyester resin having a parallelogram shape was used as a back surface reinforcing member 902 (refer to FIG. 7).

After a CV cable 904 with a connector 903 was pulled from the broader angle side 905 of the solar battery module 901, another adjacent solar battery module was connected to form a solar battery array.

By repeating the above operations, a predetermined number of solar battery modules were connected and they were further connected to an inverter or a connection box via extension leads to supply a desired power from each module.

The solar battery module of Example 3 was able to provide advantages similar to those of Example 1.

Example 4

Figure 8:
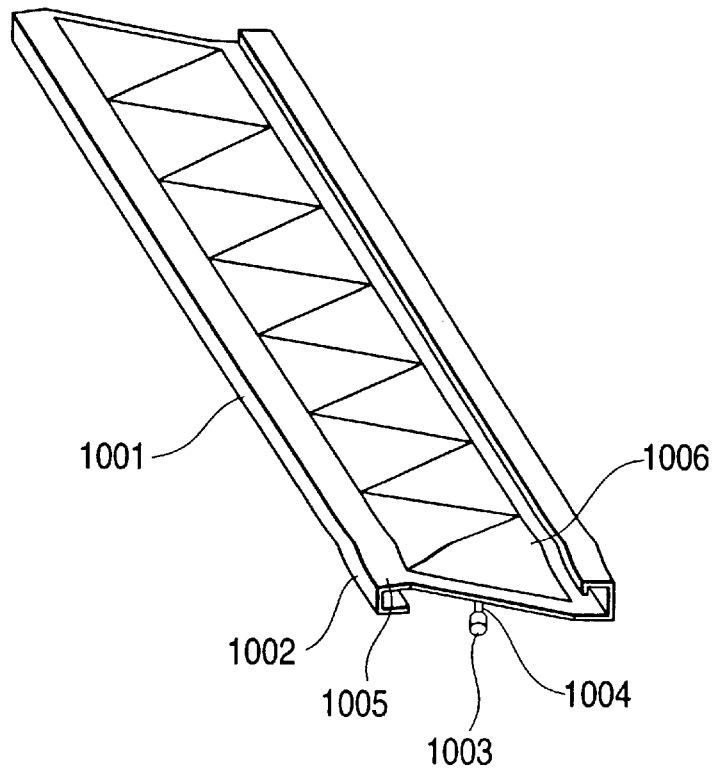
FIG. 8 is a schematic diagram showing a solar battery module according to a fourth example of the invention.

A horizontal tile roof type solar battery module 1001 was manufactured by the same method as that of Example 2, except that a steel plate coated with polyester resin having a parallelogram shape was used as a back surface reinforcing member 1002 and a triangular solar cell 1006 was used (refer to FIG. 8).

After a CV cable 1004 with a connector 1003 was pulled from the broader angle side 1005 of the solar battery module 1001, another adjacent solar battery module was connected to form a solar battery array.

By repeating the above operations, a predetermined number of solar battery modules were connected and they were further connected to an inverter or a connection box via extension leads to supply a desired power from each module.

The solar battery module of Example 4 was able to provide advantages similar to those of Example 2. Since triangular solar cells were used, they were able to be laid out without any wasted space, matching the shapes of the solar battery module and roof. A power generation efficiency per roof unit area was improved.

Example 5

A vertical tile bar roof type solar battery module 1101 was manufactured by the same method as that of Example 1, except that a steel plate coated with polyester resin having a trapezoid shape with one upright shorter side was used as a back surface reinforcing member.

Figure 9:
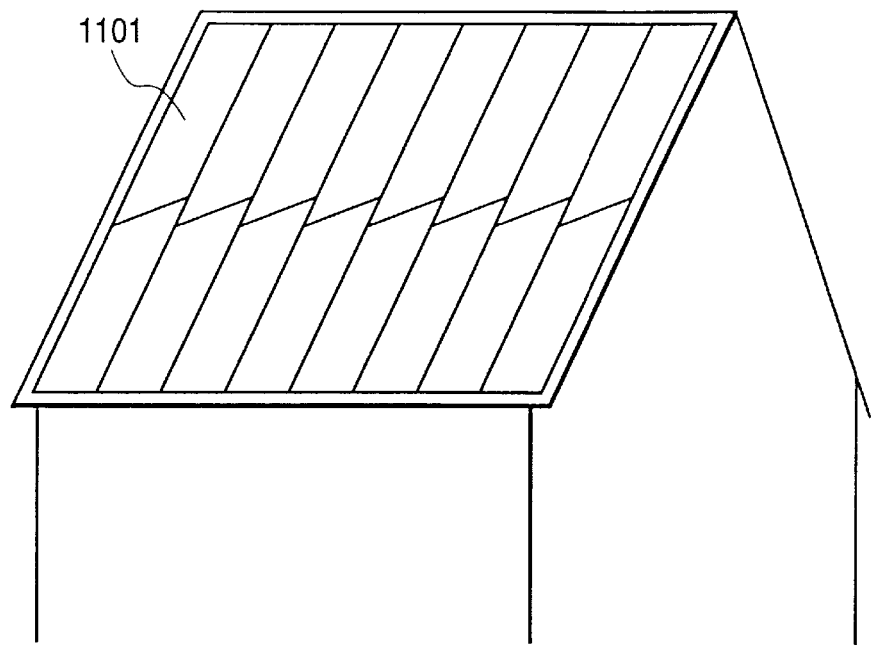
FIG. 9 is a schematic diagram showing a solar battery module according to a fifth example of the invention.

FIG. 9 illustrates an example of solar battery modules installed on a two-descending-rafter beam type roof.

After a CV cable (not shown) with a connector was pulled from the broader angle side of the solar battery module 1101, another adjacent solar battery module was connected to form a solar battery array.

By repeating the above operations, a predetermined number of solar battery modules were connected, and they are further connected to an inverter or a connection box via extension leads to supply a desired power from each module.

The solar battery module of Example 5 was able to provide advantages similar to those of Example 1.

Example 6

A horizontal tile roof type solar battery module 1201 was manufactured by the same method as that of Example 4, except that a steel plate coated with polyester resin having a trapezoid shape with one upright shorter side was used as a back surface reinforcing member.

Figure 10:
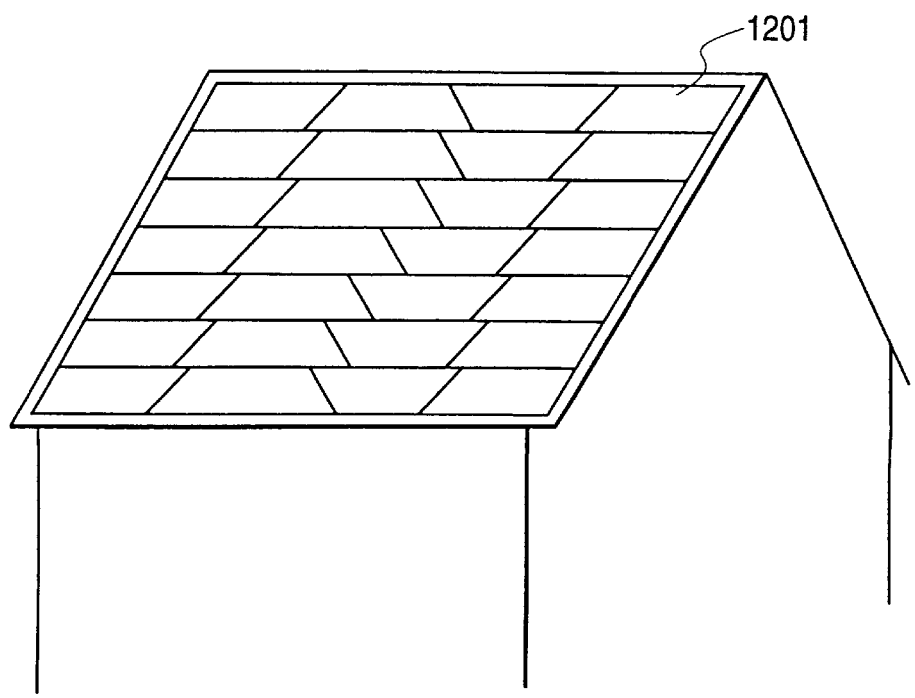
FIG. 10 is a schematic diagram illustrating installation of solar battery modules according to a sixth example of the invention.
Figure 11:
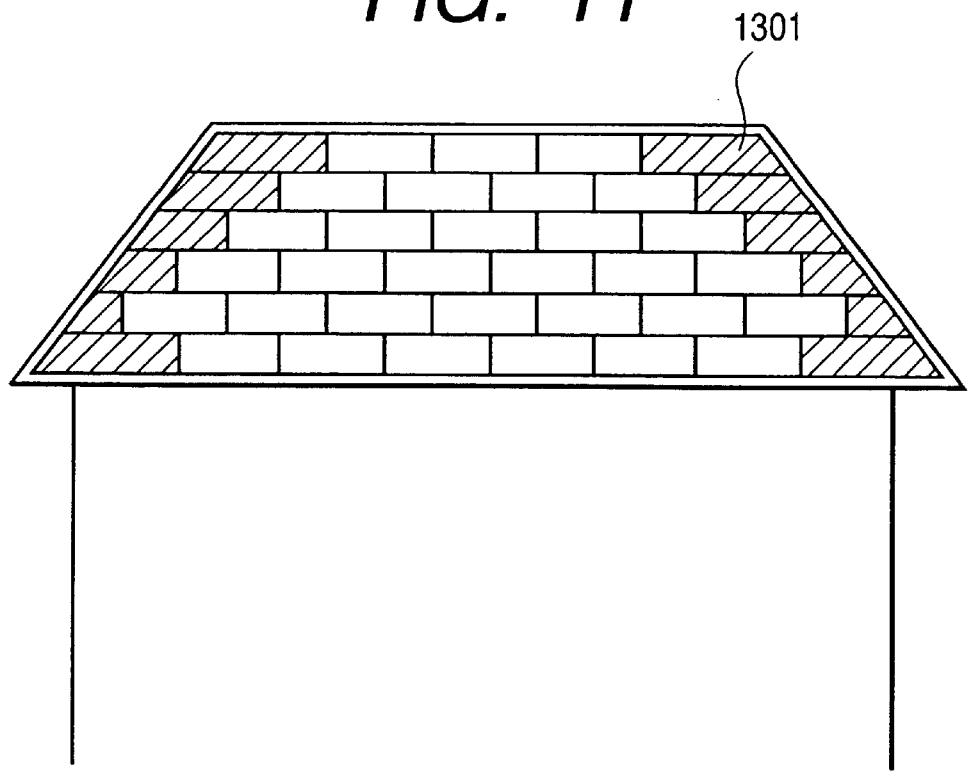
FIG. 11 is a schematic diagram illustrating installation of solar battery modules according to the sixth example of the invention.

FIG. 10 illustrates an example of solar battery modules of Example 6 installed on a two-descending-beam type roof. FIG. 11 illustrates an example of solar battery modules of Example 6 installed on a four-descending-beam type roof. In the example shown in FIG. 10, the solar battery modules of Example 6 were used only in opposite side areas of the roof, and the solar battery modules of Example 4 were used in the other areas of the roof. In the example shown in FIG. 11, the solar battery modules of Example 6 were used only in opposite side areas of the roof, and the solar battery modules of a rectangular shape were used in the other areas of the roof.

After a CV cable with a connector was pulled from the broader angle side of the solar battery module 1201 or 1301 of the trapezoid shape with one upright shorter side, another adjacent solar battery module was connected to form a solar battery array.

By repeating the above operations, a predetermined number of solar battery modules were connected, and they were further connected to an inverter or a connection box via extension leads to supply a desired power from each module.

The solar battery module of Example 6 was able to provide advantages similar to those of Example 2. If the roof shape is of the four-descending-beam type, it is not necessary to use a steel plate so as to match the roof shape, and it is possible to install solar battery modules so as to match the angles of the adjacent descending beams.

A power generation efficiency was therefore able to be improved.

Example 7

Figure 12:
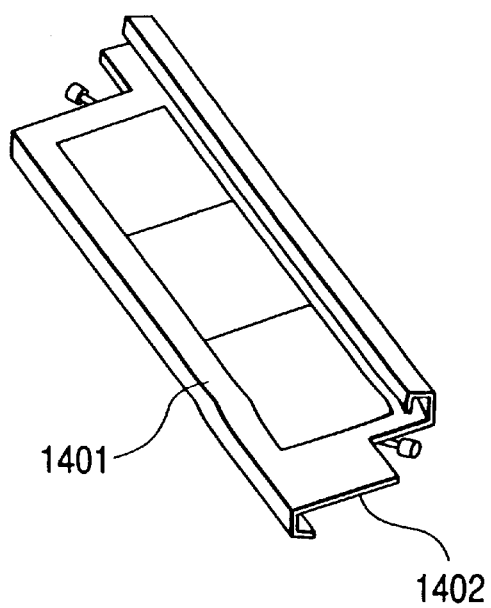
FIG. 12 is a schematic diagram illustrating installation of solar battery modules according to a seventh example of the invention.
Figure 13:
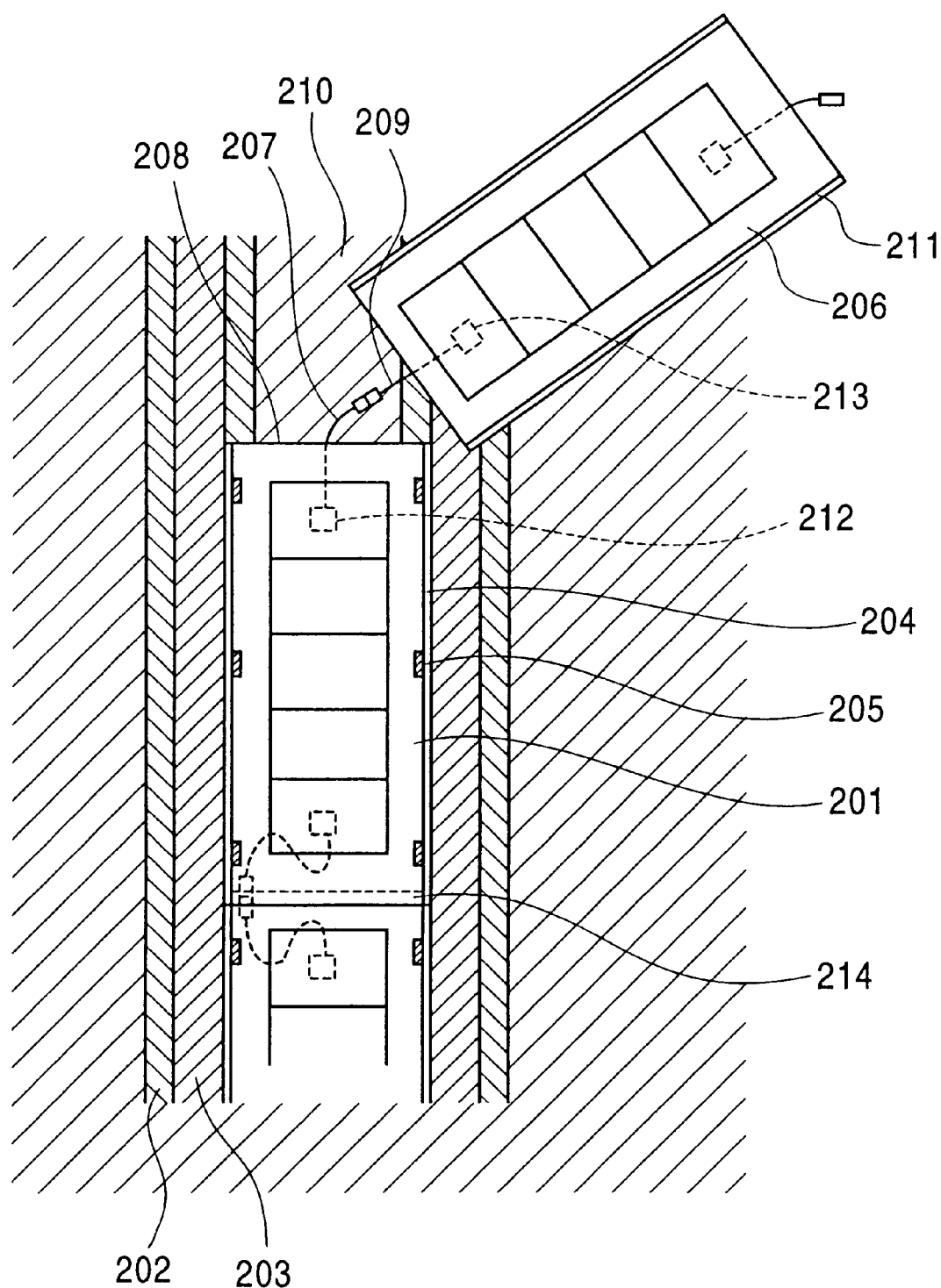
FIG. 13 is a schematic diagram illustrating installation of vertical tile bar roof type solar battery modules according to Conventional Example 1.
Figure 14:
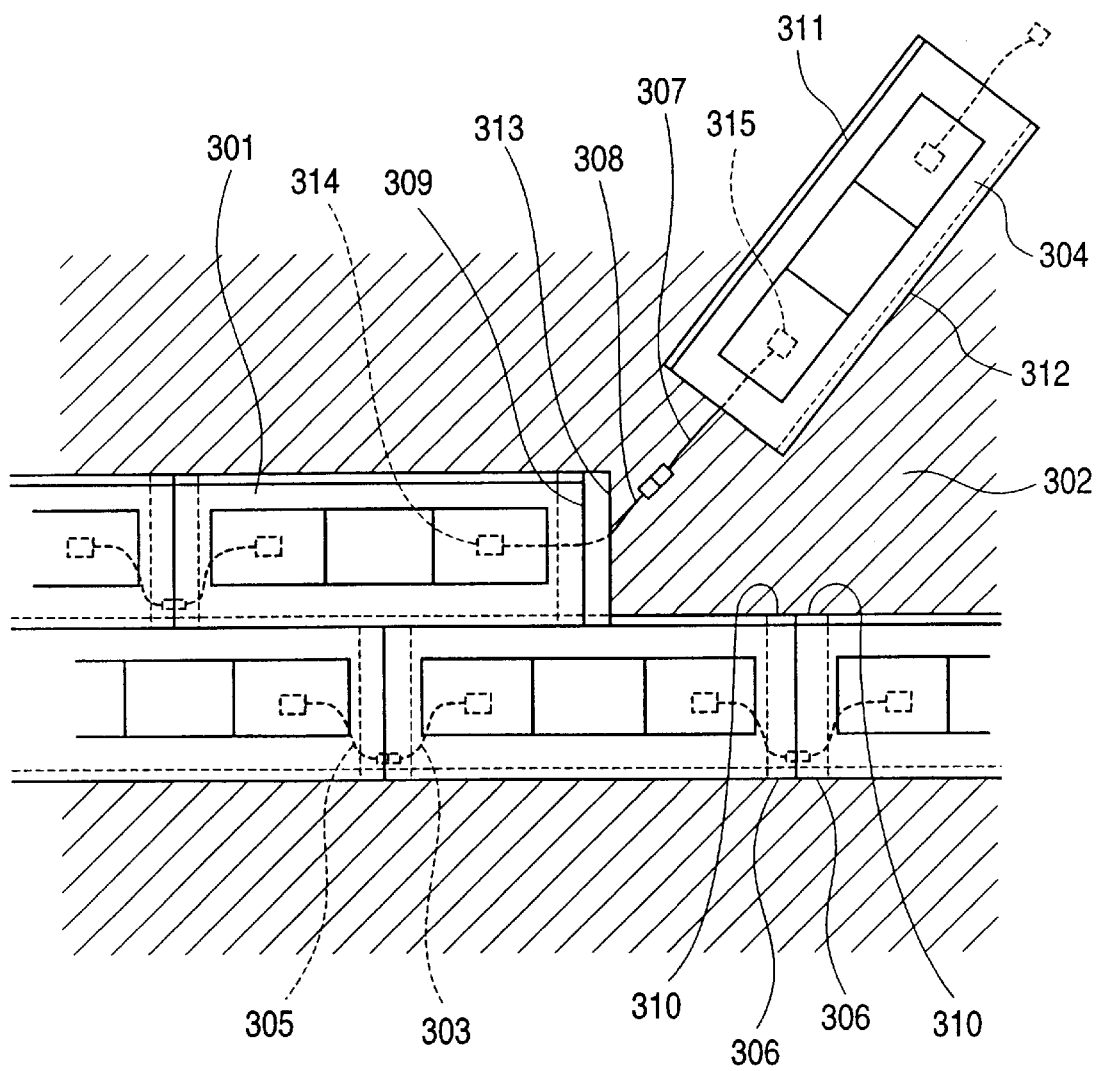
FIG. 14 is a schematic diagram illustrating installation of horizontal tile roof type solar battery modules according to Conventional Example 2.

A horizontal tile roof type solar battery module 1401 was manufactured by the same method as that of Example 2, except that a steel plate coated with polyester resin having a poly-angle shape with recesses being formed on the shorter side was used as a back surface reinforcing member 1402 (refer to FIG. 12).

By installing solar battery modules in a manner similar to that of Example 2, a predetermined number of solar battery modules were connected, and they were further connected to an inverter or a connection box via extension leads to supply a desired power from each module.

With the solar battery module of Example 7, the connector can be pulled out of the end surface of the module using the cable shorter than a conventional cable. Therefore, after the connectors of adjacent solar battery modules were connected and when the module still not fixed was installed, the curved cables were not squeezed between the eaves-side coupling of one solar battery module and the beam-side coupling of another adjacent solar battery module.

Furthermore, since the radius of curvature of the cable after the module was installed was able to be made large, stress applied to the cable coating was reduced.

Comparative Experiments

Cable clamping was evaluated when solar battery modules were connected in the manner as described in Examples 1 and 2 and Conventional Examples 1 and 2.

For the vertical tile bar roof type solar battery modules of Example 1 and Conventional Example 1, the probability of a CV cable being clamped between a spacer and a solar battery module was measured. For the horizontal tile roof type solar battery modules of Example 2 and Conventional Example 2, the probability of a CV cable being clamped around the eaves-side coupling was measured.

The connection works were performed without any attention to CV cable clamping, i.e., without touching the cables with connectors after the connector coupling, and with attention to CV cable clamping.

Results and Discussion of Comparative Experiments

The results of the comparative experiments are shown in the following table.

TABLE

EVALUATION OF WORKABILITY OF SOLAR BATTERY MODULE INSTALLATION

| EXAMPLE | WORK WITH CARE | | WORK WITHOUT CARE | |
|---|---|---|---|---|
| | CLAMPING PROBABIL- ITY | DAMAGE PROBABIL- ITY | CLAMPING PROBABIL- ITY | DAMAGE PROBABIL- ITY |
| EXAMPLE 1 | 1/100 | 0/100 | 0/100 | 0/100 |
| EXAMPLE 2 | 7/100 | 0/100 | 0/100 | 0/100 |
| CONVENT- IONAL EXAMPLE 1 | 12/100 | 0/100 | 5/100 | 0/100 |
| CONVENT- IONAL EXAMPLE 2 | 28/100 | 7/100 | 9/100 | 0/100 |

According to the experimental results, some CV cables were clamped between the solar battery module and spacer or roof base plate and damaged in Conventional Examples 1 and 2. However, no CV cable was clamped in Examples 1 and 2.

Another probability of a CV cable being clamped between the eaves-side coupling of one solar battery module and the beam-side coupling of another solar battery module on the eaves-side adjacent to the one module was measured, and another probability of a CV cable having some scratches or damages was also measured. Both probabilities when the solar battery modules of Examples 1 and 2 were used were smaller than those when the modules of Conventional Examples 1 and 2 were used. Our research of the probability of clamping the CV cable between the horizontal tile roof type solar battery module and an underlying base of the roof reveals that the probability according to the present invention is made significantly smaller than that of the conventional horizontal tile roof type solar battery module.

As described so far, the solar battery module and its installation method of the invention provided the following advantages.

(1) connection between solar battery modules was easy, and workability on site was improved considerably.

(2) connection between solar battery modules was easy, work time was shortened, and installation cost was reduced greatly.

(3) the length of an electrical wire connected to a solar battery module was able to be shortened, and a total power generation efficiency of a solar power generator system was improved.

(4) the length of an electrical wire connected to a solar battery module was able to be shortened, and cost was able to be reduced.

(5) since solar battery modules were able to be installed so as to match the roof shape, particularly the angle of a descending beam, the installation area was broadened, and a power generator efficiency per unit roof area was improved.

(6) electrical wire clamping did not occur when solar battery modules were installed so that reliability of installation works improved.

(7) electrical wire damage did not occur when solar battery modules were installed so that durability of a dielectric performance of a solar power generator was improved.

What is claimed is:

1. A solar battery module, wherein a distance between an output terminal and an end face of a solar battery module along a line connecting output terminals of adjacent solar battery modules is longer upon installation completion of the adjacent solar battery modules than during electrical connection for the adjacent solar battery modules.

2. The solar battery module according to claim 1, wherein the solar battery module has generally a trapezoid shape, a parallelogram shape, or a trapezoid shape with one upright shorter side.

3. The solar battery module according to claim 2, wherein at least one side of opposing sides has an angle equal to an angle of a descending beam of a roof on which the solar battery module is installed.

4. The solar battery module according to claim 1, wherein the solar battery module has generally a quadrilateral shape having a pair of longer sides and at least one shorter side not having a right angle relative to the longer sides.

5. The solar battery module according to claim 1, wherein the solar battery module is subjected to bending.

6. The solar battery module according to claim 2, wherein the solar battery module is a construction material integrated solar battery module.

7. The solar battery module according to claim 1, wherein a shape of a solar cell of the solar battery module is a triangle, a trapezoid or a parallelogram.

8. The solar battery module according to claim 1, wherein a solar cell of the solar battery module is made of amorphous silicon deposited on a stainless steel substrate.

9. The solar battery module according to claim 1, wherein a transparent film is formed on a surface of the solar battery module.

10. The solar battery module according to claim 1, wherein the solar battery module includes a reinforcing member formed on a back surface thereof.

11. The solar battery module according to claim 1, wherein the output terminal of the solar battery module is connected to an electrical wire with a connector.

12. A solar battery module installing method, wherein a plurality of solar battery modules recited in claim 11 are disposed, and adjacent solar battery modules are connected by pulling the electrical wires with the connectors of the solar battery modules from broader angle sides of the end faces of the solar battery modules.

13. A solar battery array wherein a plurality of solar battery modules recited in claim 1 are connected.

14. The solar battery array according to claim 13, wherein the solar battery modules are disposed in a vertical tile bar roof shape along a roof rafter direction and connected by wiring members which are passed through a space between the solar battery modules and a roof base plate.

15. The solar battery array according to claim 13, wherein the solar battery modules are disposed in a horizontal tile roof shape along a roof main beam direction and connected by wiring members which are passed through a space between the solar battery modules and a roof base plate.

16. A solar power generator, wherein the solar battery array recited in claim 13 is connected to an inverter or a connection box which controls an output of the solar battery array.

17. A solar power generator, wherein the solar battery array recited in claim 13 is connected systematically via an inverter which controls an output of the solar battery array.

18. A solar battery module installing method, wherein a distance between an output terminal and an end face of a solar battery module along a line connecting output terminals of adjacent solar battery modules is made longer upon installation completion of the adjacent solar battery modules than during electrical connection of the adjacent solar battery modules.

19. A solar battery module having photoelectromotive force elements, a support plate and an electrical wire, capable of electrically connecting the electrical wire to an electrical wire of another solar battery module, wherein a distance between a start point where the electrical wire is connected to the support plate and a cross point where the electrical wire crosses one side of the solar battery module, when the electrical wire of the solar battery module is connected to the electrical wire of the other solar battery module and both solar battery modules are spaced so that both electrical wires extend straight, is shorter than half a distance between the start point of the solar battery module and the start point of the other solar battery module, when the solar battery modules are adjacent to one another.

20. A solar battery module comprising:

a wiring, one end of which is fixed to a start point, a photovoltaic element, and a supporting plate, wherein a wire drawing out side of said supporting plate is inclined with regard to another two sides sandwiching the wire drawing out side and wherein a distance from the start point to the other end of said wiring is shorter than a maximum distance from the start point to the end of the wire drawing out side.

21. A method for mounting a solar battery module comprising:

a wiring, one end of which is fixed to a start point, a photovoltaic element, and a supporting plate, wherein a wire drawing out side of said supporting plate is inclined with regard to another two sides sandwiching the wire drawing out side and wherein a distance from the start point to the other end of said wiring is shorter than a maximum distance from the start point to the end of the wire drawing out side.

22. A roof comprising a solar battery module comprising:

a wiring, one end of which is fixed to a start point, a photovoltaic element, and a supporting plate, wherein a wire drawing out side of said supporting plate is inclined with regard to another two sides sandwiching the wire drawing out side and wherein a distance from the start point to the other end of said wiring is shorter than a maximum distance from the start point to the end of the wire drawing out side.

* * * * *

UNITED STATES PATENT AND TRADEMARK OFFICE
CERTIFICATE OF CORRECTION

PATENT NO. : 6,207,889 B1
DATED : March 27, 2001
INVENTOR(S) : Fumitaka Toyomura et al.

It is certified that error appears in the above-identified patent and that said Letters Patent is hereby corrected as shown below:

Title page,
Item [57], ABSTRACT, line 3, "and" should read -- and which --.

Column 1,
Line 44, "204," should read -- 203, --; and
Line 45, "203" should read -- 204 --.

Column 4,
Line 21, "there by" should read -- thereby --.

Column 5,
Line 38, "sin e" should read -- sin () --.

Column 6,
Line 66, "Instead" should read -- Instead of the --; and
Line 67, "of the" should be deleted --.

Column 7,
Line 39, "water" should read -- water- --.

Column 8,
Line 9, "mortal," should read -- mortar, --.

Column 11,
Line 52, "are" should read -- were --.

Signed and Sealed this

Twelfth Day of March, 2002

Attest:

*Attesting Officer*

JAMES E. ROGAN
*Director of the United States Patent and Trademark Office*